(12) United States Patent
Cho et al.

(10) Patent No.: US 12,193,160 B2
(45) Date of Patent: Jan. 7, 2025

(54) PRINTED CIRCUIT BOARD

(71) Applicant: SAMSUNG ELECTRO-MECHANICS CO., LTD., Suwon-si (KR)

(72) Inventors: Jung Hyun Cho, Suwon-si (KR); Jin Won Lee, Suwon-si (KR); Byung Kuk Kang, Suwon-si (KR); Chang Soo Woo, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 648 days.

(21) Appl. No.: 17/196,645

(22) Filed: Mar. 9, 2021

(65) Prior Publication Data
US 2022/0159839 A1 May 19, 2022

(30) Foreign Application Priority Data
Nov. 19, 2020 (KR) .................. 10-2020-0155770

(51) Int. Cl.
*H01F 27/24* (2006.01)
*H01F 27/28* (2006.01)
*H01F 27/30* (2006.01)
*H05K 1/02* (2006.01)
*H05K 1/11* (2006.01)
*H05K 1/16* (2006.01)

(52) U.S. Cl.
CPC ............ *H05K 1/165* (2013.01); *H01F 27/24* (2013.01); *H01F 27/2804* (2013.01); *H01F 27/306* (2013.01); *H05K 1/0298* (2013.01); *H05K 1/115* (2013.01)

(58) Field of Classification Search
CPC ...... H05K 1/165; H05K 1/0298; H05K 1/115; H05K 2201/086; H05K 3/4602; H05K 1/09; H05K 1/111; H05K 1/185; H05K 3/4644; H01F 27/24; H01F 27/2804; H01F 27/306; H01F 2017/002; H01F 17/04; H01F 17/0013
See application file for complete search history.

(56) References Cited

U.S. PATENT DOCUMENTS 10,290,414 B2    5/2019  Yun et al.
10,842,021 B1   11/2020  Song et al.
(Continued)

FOREIGN PATENT DOCUMENTS

JP    2017-143254 A    8/2017
JP    2017-157793    *  9/2017
(Continued)

OTHER PUBLICATIONS

Office Action issued in corresponding Korean Patent Application No. 10-2020-0155770 dated Nov. 21, 2024, with English translation.

*Primary Examiner* — Mang Tin Bik Lian
(74) *Attorney, Agent, or Firm* — MORGAN, LEWIS & BOCKIUS LLP

(57) ABSTRACT

A printed circuit board includes: a core substrate including a plurality of core layers; a plurality of magnetic members embedded in each of the plurality of core layers; a first coil pattern disposed on the core substrate; and a second coil pattern disposed below the core substrate.

23 Claims, 10 Drawing Sheets

(56) References Cited

U.S. PATENT DOCUMENTS

| | | | |
|---|---|---|---|
| 11,763,975 B2* | 9/2023 | Kodama | H01F 17/0013 |
| | | | 336/234 |
| 2009/0294161 A1* | 12/2009 | Yoshimura | H05K 3/4641 |
| | | | 174/258 |
| 2014/0118976 A1* | 5/2014 | Yoshikawa | H01L 23/5384 |
| | | | 361/761 |
| 2014/0353022 A1* | 12/2014 | Morita | H05K 1/165 |
| | | | 174/260 |
| 2017/0231094 A1 | 8/2017 | Blackshear et al. | |
| 2018/0308612 A1 | 10/2018 | Park et al. | |
| 2018/0342342 A1* | 11/2018 | Taniguchi | H05K 3/4661 |
| 2018/0374803 A1 | 12/2018 | Aoki et al. | |
| 2021/0195748 A1* | 6/2021 | Kawai | H05K 1/0251 |
| 2021/0298178 A1* | 9/2021 | Kawai | H05K 1/185 |

FOREIGN PATENT DOCUMENTS

| | | |
|---|---|---|
| JP | 2019-9320 A | 1/2019 |
| KR | 10-2017-0045113 A | 4/2017 |
| KR | 10-2021-0073162 A | 6/2021 |

\* cited by examiner

PRINTED CIRCUIT BOARD

CROSS-REFERENCE TO RELATED APPLICATION(S)

This application claims benefit of priority to Korean Patent Application No. 10-2020-0155770 filed on Nov. 19, 2020 in the Korean Intellectual Property Office, the disclosure of which is incorporated herein by reference in its entirety.

TECHNICAL FIELD

The present disclosure relates to a printed circuit board.

BACKGROUND

Central processing units (CPUs), application specific integrated circuits (ASICs), application processors (APs), and the like have recently been supplied with power from power management integrated circuits (PMICs). In order to improve power efficiency, there has recently been an increase in power supply switching frequency of the PMIC. Accordingly, there has been a need for a package substrate in the form of a multilayer printed circuit board having an inductor function.

Currently, the switching frequency of power is raised to efficiently supply power through an integrated voltage regulator (IVR). In order to implement such technology, it is important to improve performances of a capacitor and an inductor required for the IVR. In particular, it is necessary to increase the performance while reducing a size of the inductor.

SUMMARY

An aspect of the present disclosure may provide a printed circuit board having an inductor function capable of maintaining high magnetic permeability even at a high frequency.

Another aspect of the present disclosure may provide a printed circuit board whose core can be manufactured thickly, with a magnetic material embedded in the thick core so that the board can be thin.

According to an aspect of the present disclosure, a printed circuit board may include: a core substrate including a plurality of core layers; a plurality of magnetic members embedded in each of the plurality of core layers; a first coil pattern disposed on the core substrate; and a second coil pattern disposed below the core substrate.

According to another aspect of the present disclosure, a printed circuit board may include: a core substrate; a plurality of magnetic members embedded in the core substrate; a first coil pattern disposed on the core substrate; and a second coil pattern disposed below the core substrate. The plurality of magnetic members may include first and second magnetic members having different structures from each other, the first magnetic member may include a magnetic element, and the second magnetic member may include a base layer and a magnetic layer attached to the base layer.

According to another aspect of the present disclosure, a printed circuit board may include: a core substrate including a core insulating layer, and first and second core layers disposed on opposing sides of the core insulating layer, respectively; a first coil pattern disposed on the first core layer; a second coil pattern disposed below the second core layer; a first magnetic member disposed in a cavity of the first core layer and between the first coil pattern and the core insulating layer; and a second magnetic member disposed in a cavity of the second core layer and between the second coil pattern and the core insulating layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will be described in detail with reference to the accompanying drawings.

In the present disclosure, the expression "side portion", "side surface", or the like refers to a direction toward a first direction or a second direction or a surface in that direction for convenience, the expression "upper side", "upper portion", "upper surface", or the like refers to a direction toward a third direction or a surface in that direction for convenience, and the expression "lower side", "lower portion", "upper surface", or the like refers to a direction toward an opposite direction to the third direction or a surface in that direction for convenience. In addition, the expression "positioned on the side portion, the upper side, the upper portion, the lower side, or the lower portion" conceptually includes a case in which a target component is positioned in a corresponding direction but is not in direct contact with a reference component, as well as a case in which the target component is in direct contact with the reference component in the corresponding direction. However, these directions are defined for convenience of explanation, and the claims are not particularly limited by the definition described above, and the concepts of the upper and lower portions, sides and surfaces may be changed.

Electronic Device

Figure 1:
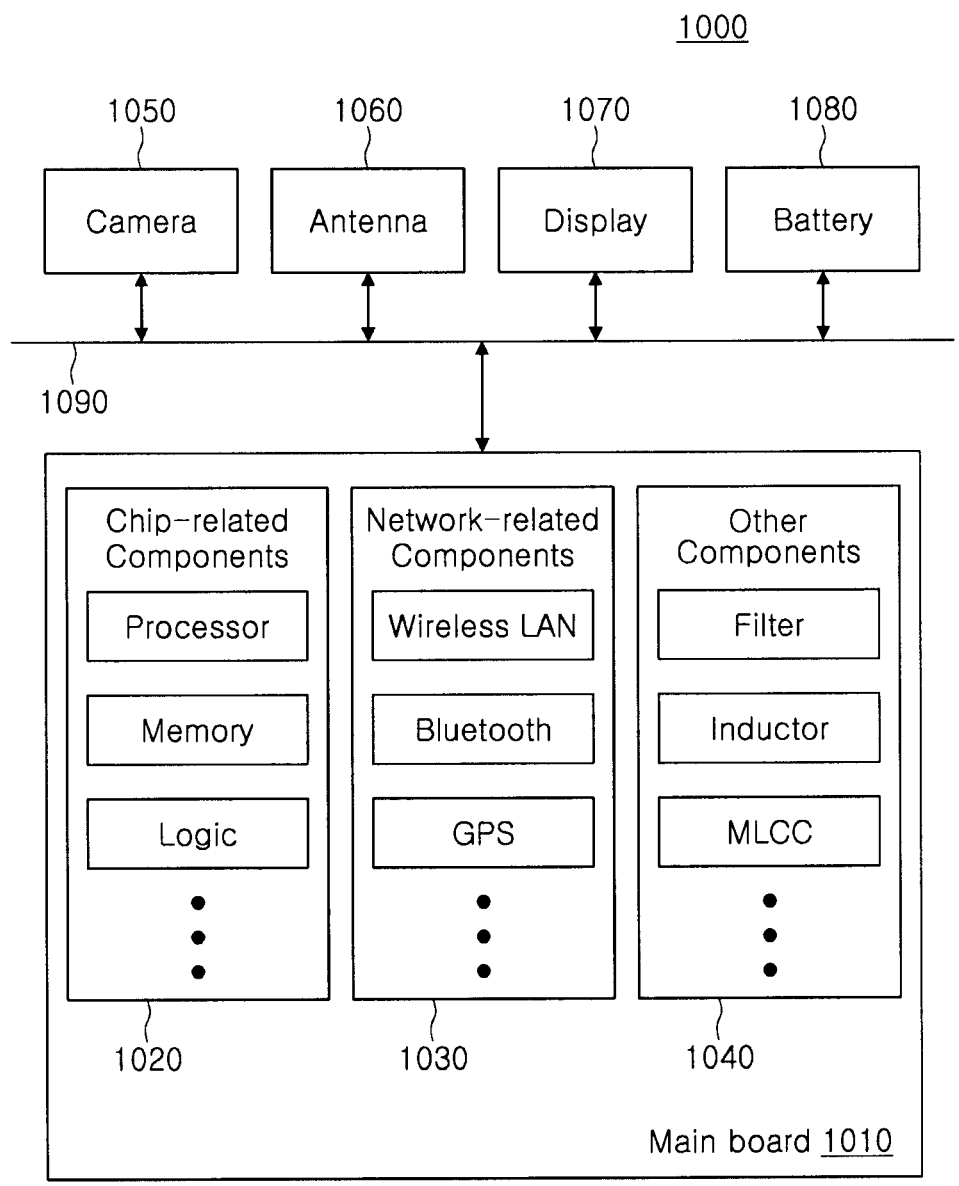
FIG. 1 is a block diagram schematically illustrating an example of an electronic device system.

FIG. 1 is a block diagram schematically illustrating an example of an electronic device system.

Referring to FIG. 1, an electronic device 1000 may accommodate a main board 1010 therein. Chip-related components 1020, network-related components 1030, and other components 1040 may be physically and/or electrically connected to the main board 1010. These components may also be coupled to other electronic components, which will be described later, to form various signal lines 1090.

The chip-related components 1020 may include: a memory chip such as a volatile memory (e.g. a dynamic random access memory (DRAM)), a non-volatile memory (e.g. a read only memory (ROM)), or a flash memory; an application processor chip such as a central processor (e.g. a central processing unit (CPU)), a graphics processor (e.g. a graphics processing unit (GPU)), a digital signal processor, a cryptography processor, a microprocessor, or a microcontroller; and a logic chip such as an analog-to-digital converter or an application-specific integrated circuit (ASIC). However, the chip-related components 1020 are not limited thereto, and may include any other types of chip-related electronic components. Also, these electronic components 1020 may also be combined with each other. The chip-related component 1020 may be in the form of a package including the above-described chip or electronic component.

The network-related components 1030 may include wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G, and any other wireless and wired protocols designated thereafter. However, the network-related components 1030 are not limited thereto, and may include any other wireless or wired standards or protocols. Also, the network-related components 1030 may be combined with each other, together with the chip-related components 1020.

The other components 1040 may include a high-frequency inductor, a ferrite inductor, a power inductor, ferrite beads, low-temperature co-firing ceramics (LTCC), an electro-magnetic interference (EMI) filter, a multi-layer ceramic condenser (MLCC), and the like. However, the other components 1040 are not limited thereto, and may include passive elements in the form of chip components used for various other purposes. Also, the other components 1040 may be combined with each other, together with the chip-related components 1020 and/or the network-related components 1030.

The electronic device 1000 may include any other electronic components that may be or may not be physically and/or electrically connected to the main board 1010 according to the type of the electronic device 1000. Examples of the other electronic components may include a camera 1050, an antenna 1060, a display 1070, and a battery 1080. However, the other electronic components are not limited thereto, and may be an audio codec, a video codec, a power amplifier, a compass, an accelerometer, a gyroscope, a speaker, a mass storage device (e.g. a hard disk drive), a compact disc (CD), and a digital versatile disc (DVD). Also, the electronic device 1000 may include any other electronic components used for various purposes according to the type of the electronic device 1000.

The electronic device 1000 may be a smartphone, a personal digital assistant, a digital video camera, a digital still camera, a network system, a computer, a monitor, a tablet, a laptop, a netbook, a television, a video game machine, a smart watch, or an automotive component. However, the electronic device 1000 is not limited thereto, and may be any other electronic device processing data.

Figure 2:
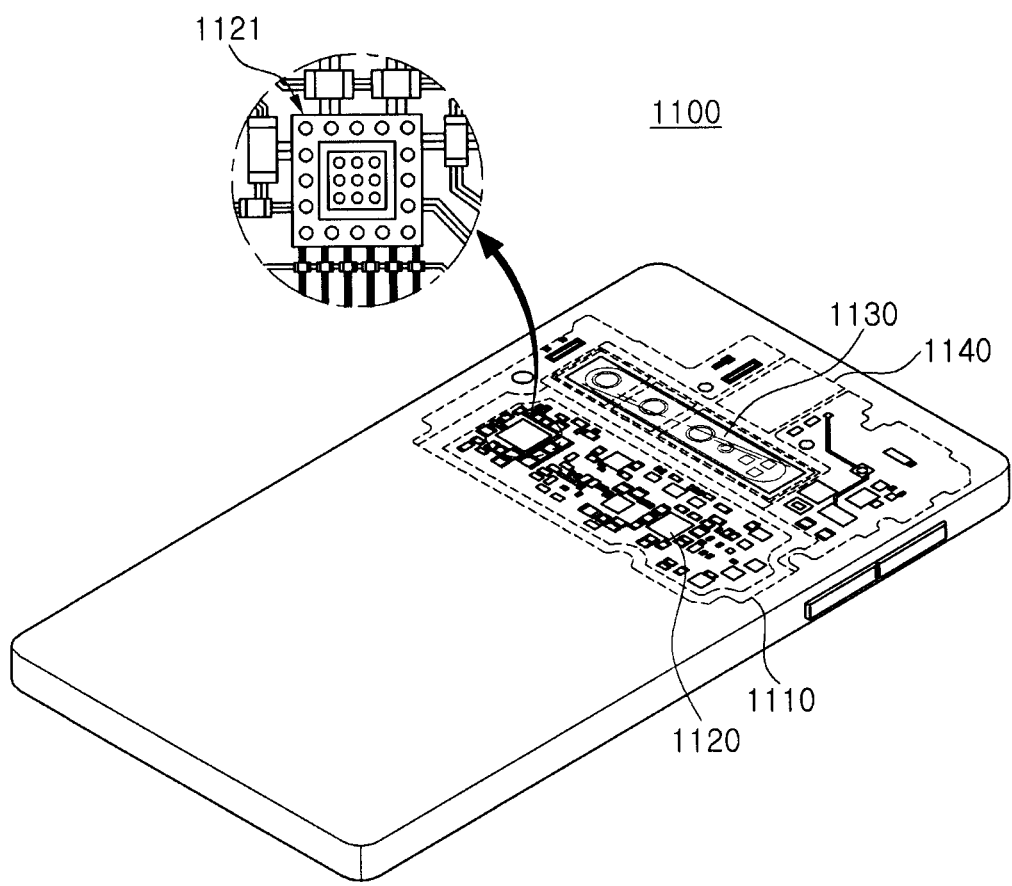
FIG. 2 is a perspective view schematically illustrating an example of an electronic device.

FIG. 2 is a perspective view schematically illustrating an example of an electronic device.

Referring to FIG. 2, the electronic device may be, for example, a smartphone 1100. A main board 1110 may be accommodated in the smartphone 1100, and various electronic components 1120 may be physically and/or electrically connected to the main board 1110. Also, other electronic components that may be or may not be physically and/or electrically connected to the main board 1110, such as a camera 1130 and/or a speaker 1140, may be accommodated in the smartphone 1100. Some of the electronic components 1120 may be the above-described chip-related components, for example, semiconductor packages 1121, but are not limited thereto. The semiconductor package 1121 may be a type in which a semiconductor chip or a passive component is surface-mounted on a package substrate in the form of a multilayer printed circuit board, but is not limited thereto. Meanwhile, the electronic device is not necessarily limited to the smartphone 1100, and may be another electronic device as described above.

Printed Circuit Board

Figure 3:
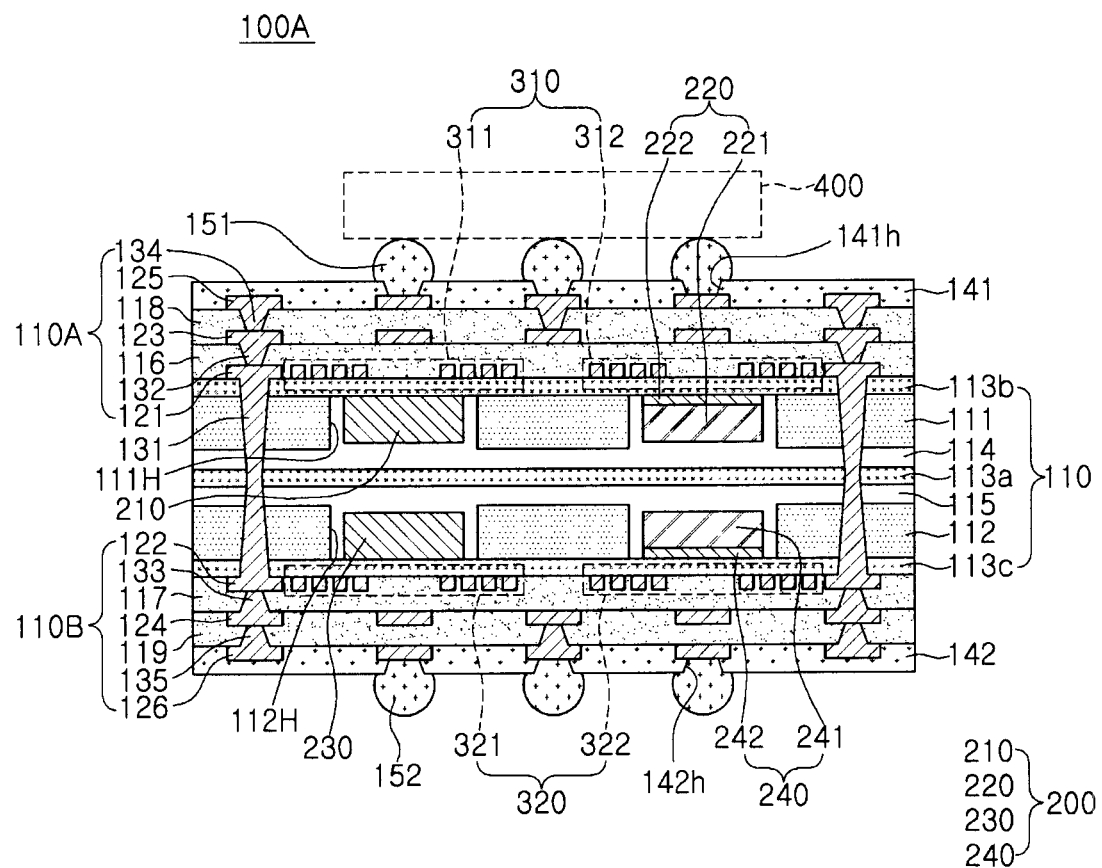
FIG. 3 is a cross-sectional view schematically illustrating a printed circuit board according to a first exemplary embodiment in the present disclosure.
Figure 4:
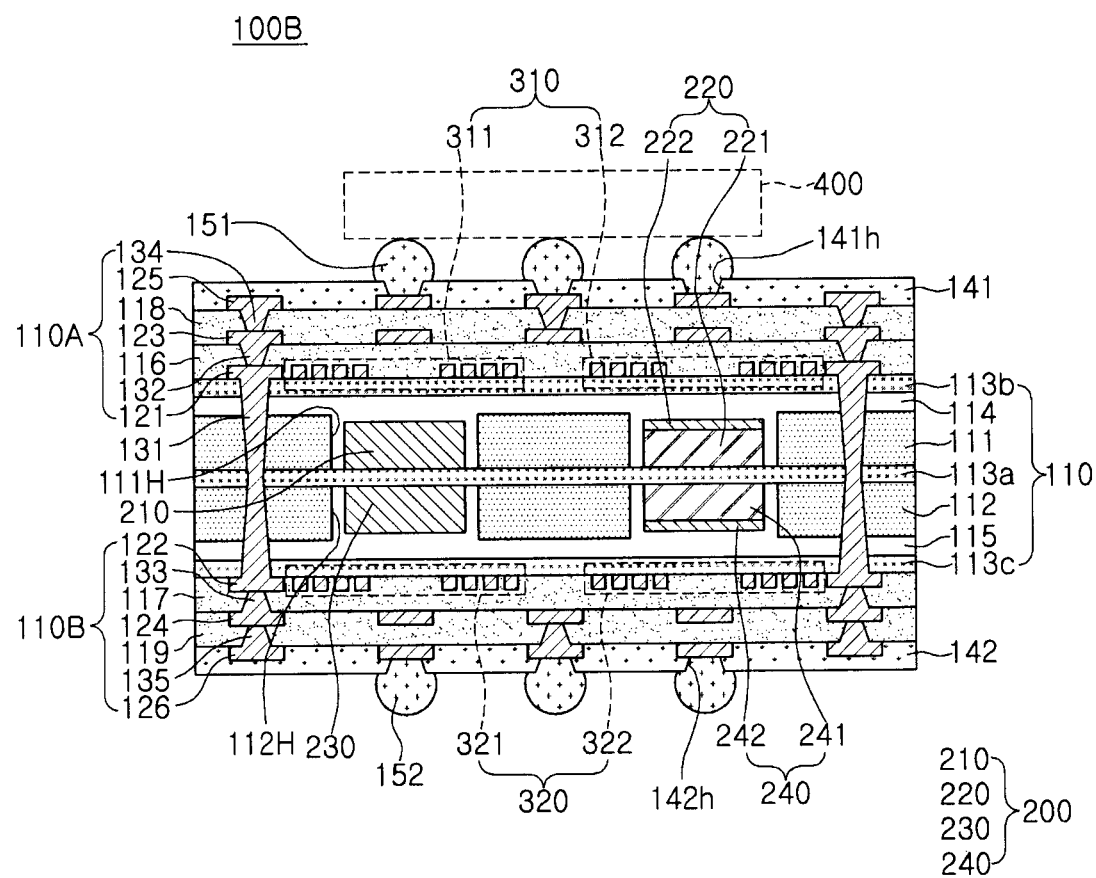
FIG. 4 is a cross-sectional view schematically illustrating a printed circuit board according to a second exemplary embodiment in the present disclosure.
Figure 5:
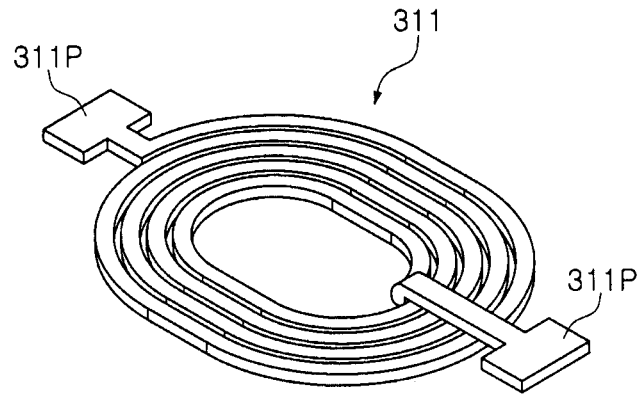
FIG. 5 is a plan view schematically illustrating an example of a coil pattern applied to the printed circuit boards of FIGS. 3 and 4.

FIG. 3 is a cross-sectional view schematically illustrating a printed circuit board according to a first exemplary embodiment in the present disclosure, and FIG. 5 is a plan view schematically illustrating an example of a coil pattern applied to the printed circuit boards of FIG. 3 and FIG. 4 to be described later.

Referring to FIG. 3, the printed circuit board 100A according to the first exemplary embodiment may include magnetic members 210, 220, 230, and 240 embedded in core layers 111 and 112, and a first coil pattern 310 and a second coil pattern 320 disposed on and under the core layers 111 and 112 respectively. In this case, the first and second coil patterns 310 and 320 may have a spiral thin-film coil pattern structure. Hereinafter, specific components that may be provided in the printed circuit board 100A will be described in detail.

The printed circuit board 100A may include a plurality of insulating layers 111 to 119, a plurality of wiring layers 121 to 126, and a plurality of via layers 131 to 135. In this case, the magnetic members 210, 220, 230, and 240 may be embedded in at least some of the plurality of insulating layers.

For example, in the printed circuit board 100A according to the first exemplary embodiment in the present disclosure, a core substrate 110 may include a plurality of first and second core layers 111 and 112 and a plurality of first to third core insulating layers 113a to 113c. The plurality of first and second core layers 111 and 112 may be first and second insulating layers 111 and 112, respectively, and the plurality of core insulating layers 113a to 113c may be collectively referred to as third insulating layers.

In addition, the core substrate 110 may include fourth and fifth insulating layers 114 and 115 disposed between the plurality of first and second core layers 111 and 112 and the plurality of first to third core insulating layers 113a to 113c, and a through via 131 penetrating through the core substrate 110.

In addition, the printed circuit board 100A according to the first exemplary embodiment in the present disclosure may include first and second build-up layers 110A and 110B covering both surfaces of the core substrate 110.

The first build-up layer 110A, a build-up layer disposed on an upper surface of the core substrate 110, may include a first wiring layer 121 and a sixth insulating layer 116 disposed on the core insulating layer 113b, a third wiring layer 123 and an eighth insulating layer 118 disposed on the sixth insulating layer 116, and a fifth wiring layer 125 disposed on the eighth insulating layer 118.

On the other hand, the second build-up layer 110B, a build-up layer disposed on a lower surface of the core substrate 110, may include a second wiring layer 122 and a seventh insulating layer 117 disposed on the core insulating layer 113c, a fourth wiring layer 124 and a ninth insulating layer 119 disposed on the seventh insulating layer 117, and a sixth wiring layer 126 disposed on the ninth insulating layer 119.

The first and second build-up layers 110A and 110B described above may be collectively referred to as build-up layers. Although the two build-up layers are illustrated, the number of build-up layers may be more than or less than two.

Meanwhile, the printed circuit board 100A according to the first exemplary embodiment may further include a first passivation layer 141 disposed on the first build-up layer 110A and having a plurality of first openings 141h each exposing at least a portion of the fifth wiring layer 125, a second passivation layer 142 disposed on the second build-up layer 110B and having a plurality of second openings 142h each exposing at least a portion of the sixth wiring layer 126, a plurality of first electrical connection metals 151 disposed on the plurality of first openings 141h, respectively, and electrically connected to the exposed portions of the fifth wiring layer 125, respectively, and a plurality of second electrical connection metals 152 disposed on the plurality of second openings 142h, respectively, and electrically connected to the exposed portions of the sixth wiring layer 126, respectively.

As described above, central processing units (CPUs), application specific integrated circuits (ASICs), application processors (APs), and the like have recently been supplied with power from power management integrated circuits (PMICs). In order to improve power efficiency, there has recently been an increase in power supply switching frequency of the PMIC. In this regard, it may be considered to dispose an inductor on the main board, separately from the package substrate on which an integrated circuit (IC) is surface-mounted. However, in this case, a high-capacity inductor is required. In particular, an electrical path between the inductor and the integrated circuit (IC) mounted on the package substrate may be long, resulting in an increase in resistance and a decrease in power efficiency. Alternatively, it may be considered to simply form a coil in a pattern in the package substrate. In this case, however, the coil is formed in air rather than on a magnetic material, and thus, there may be difficulty in implementing capacitance, and the overall size of the package substrate may increase because it is required to use a large area of the package substrate in forming the pattern coil therein. Alternatively, it may be considered to surface-mount a die-type inductor on a bottom surface of the package substrate. In this case, however, the cost of the die-type inductor may be significant.

In contrast, the printed circuit board 100A according to the first exemplary embodiment may include a plurality of first to fourth magnetic members 210, 220, 230, and 240. The plurality of first to fourth magnetic members 210, 220, 230, and 240 may be collectively referred to as magnetic members 200.

In the printed circuit board 100A according to the first exemplary embodiment, the first core layer 111 may have a plurality of first cavities 111H, and the first and second magnetic members 210 and 220 may be disposed in the respective first cavities 111H. The first and second magnetic members 210 and 220 may be embedded, for example, to be at least partially covered by the fourth insulating layer 114, while being disposed inside the first cavities 111H.

The second core layer 112 may also have a plurality of second cavities 112H, and the third and fourth magnetic members 230 and 240 may be disposed in the respective second cavities 112H. The third and fourth magnetic members 230 and 240 may be embedded, for example, to be at least partially covered by the fifth insulating layer 115, while being disposed inside the second cavities 112H.

In addition, in the printed circuit board 100A according to the first exemplary embodiment, each of the first to fourth magnetic members 210, 220, 230, and 240 may be disposed on at least one of the first to third core insulating layers 113a to 113c. For example, the first and second magnetic members 210 and 220 may be disposed on the second core insulating layer 113b to contact the second core insulating layer 113b, and the third and fourth magnetic members 230 and 240 may be disposed on the third core insulating layer 113c to contact the third core insulating layer 113c.

In addition, the first coil pattern 310 may be disposed on the core substrate 110, and the second coil pattern 320 may be disposed below the core substrate 110. As described above, since the magnetic members 200 are in an embedded type, high capacitance can be implemented in the printed circuit board 100A according to the present disclosure. For example, the second and fourth magnetic members 220 and 240 may be laminates including magnetic layers 222 and 242, respectively, for maintaining a high magnetic permeability at a high frequency, as will be described later. Furthermore, since the coil patterns 310 and 320 are disposed adjacent to the plurality of magnetic members 200, inductance performance may be improved.

Hereinafter, each component of the printed circuit board 100A according to the present disclosure will be described in more detail.

The core layers 111 and 112 may include a plurality of first and second core layers 111 and 112, and the first and second core layers 111 and 112 may be a core substrate that is the center of the printed circuit board 100A. As a material of the first and second core layers 111 and 112, an insulating material may be used. Here, the insulating material may be a thermosetting resin such as an epoxy resin, a thermoplastic resin such as polyimide, or a material including a reinforcing material such as a glass fiber, glass cloth, or glass fabric and/or an inorganic filler together with the aforementioned resin, e.g. a copper clad laminate (CCL) or an unclad CCL. However, the insulating material is not limited thereto. As the first and second core layers 111 and 112, metal plates or glass plates may be used, or ceramic plates may be used. If necessary, a liquid crystal polymer (LCP) may be used as a material of the first and second core layers 111 and 112. The first and second core layers 111 and 112 may have cavities 111H and 112H, respectively, and the magnetic members 200 may be disposed in the respective cavities 111H and 112H.

The core insulating layers 113 may include a plurality of first to third core insulating layers 113a to 113c. The first core insulating layer 113a may be located in the center portion of the core substrate 110, and the second and third core insulating layers 113b and 113c may be disposed on the first and second core layers 111 and 112, respectively. The second core insulating layer 113b may be disposed between the first core layer 111 and the first coil pattern 310, and the third core insulating layer 113c may be disposed between the second core layer 112 and the second coil pattern 320. In other words, each of the second and third core insulating layers 113b and 113c may be disposed on an outer layer of the core substrate 110. The first to third core insulating layers 113a to 113c may also include the same material as the first and second core layers 111 and 112 as described above. However, the material of the first to third core insulating layers 113a to 113c is not limited thereto, and the first to third core insulating layers 113a to 113c may include a different material from the first and second core layers 111 and 112 among the above-described materials that may be used for the first and second core layers 111 and 112.

In FIG. 3, the first to third core insulating layers 113a to 113c are disposed. However, boundaries between the first to third core insulating layers 113a to 113c and the fourth and fifth insulating layers 114 and 115 and the core layers 111 and 112 may be clear or unclear. If the boundaries are unclear or if necessary, the first to third core insulating layers 113a to 113c may be omitted.

The magnetic members 200 may be a magnetic element type, each including a magnetic material having a magnetic permeability, or in a laminate type, each including a base layer and a magnetic layer disposed on the base layer. In the printed circuit board 100A according to the present disclosure, the first and third magnetic members 210 and 230 may be the magnetic element type, and the second and fourth magnetic members 220 and 240 may be the laminate type, including base layers 221 and 241 and magnetic layers 222 and 242 disposed on the base layers 221 and 241, respectively.

The magnetic members 200 may have, but not limited to, a square column shape or a cylindrical shape in accordance with the inductor characteristics regardless of whether the magnetic members 200 are in the magnetic element type or in the laminate type.

For the first and third magnetic members 210 and 230 that are in the magnetic element type, a material having a high magnetic permeability is used to constitute an entire magnetic block, resulting in an advantageous effect in terms of productivity and cost.

In the second and fourth magnetic members 220 and 240 that are in the laminate type, each including a base layer and a magnetic layer disposed on the base layer, the base layers 221 and 241 may serve as substrates when forming the magnetic layers 222 and 242. For example, the magnetic layers 222 and 242 may be attached to the base layers 221 and 241, respectively, by sputtering or evaporation. Atoms or molecules ejected from a target material are collected on surfaces of the base layers 221 and 241, such that the magnetic layers 222 and 242 are formed. The base layers 221 and 241 may include an insulating material. For example, the base layers 221 and 241 may include glass or an organic material, or may be prepreg or an Ajinomoto build-up film (ABF). Alternatively, the base layers 221 and 241 may be silicon wafers formed of single crystal silicon (Si).

The magnetic layers 222 and 242 may include a ferromagnetic material to increase magnetic fields, which are induced by the first and second coil patterns 310 and 320. For example, the magnetic layers 222 and 242 may contain a cobalt-tantalum-zirconium alloy, a cobalt-niobium-zirconium alloy, a nickel-iron (Ni—Fe) alloy, a cobalt-zirconium oxide alloy, or the like, but the material of the magnetic layers 222 and 242 is not limited thereto as long as it is a magnetic material having a high magnetic permeability. The magnetic layers 222 and 242 may be formed by sputtering, and thus may be formed to have a thin film-level thickness, that is, a thickness of several micrometers. The magnetic layers 222 and 242 may be each formed of a single layer or multiple layers. When the magnetic layers 222 and 242 are each formed of multiple layers, each layer may have a thickness of about 0.1 to 3 µm, but the thickness of each layer is not limited thereto. Meanwhile, since the magnetic layers 222 and 242 are not directly formed on the printed circuit board, the magnetic layers 222 and 242 can be embedded at a thin film level. For example, after the base layers 221 and 241 are put into thin film formation equipment and the magnetic layers 222 and 242 are formed, the second and fourth magnetic members 220 and 240 may be cut to required sizes and then disposed into the cavities 111H and 112H of the first and second core layers 111 and 112, respectively. Therefore, the second and fourth magnetic members 220 and 240 can be embedded into the printed circuit board in any size without being limited on the basis of a work size. In this way, a higher magnetic permeability can be implemented when the magnetic member has a structure in which the magnetic layer is disposed on the base layer than when the magnetic member is entirely formed of a magnetic material in the magnetic element type.

Meanwhile, the first and third magnetic members 210 and 230 may be the magnetic element type, and may contain a cobalt-tantalum-zirconium alloy, a cobalt-niobium-zirconium alloy, a nickel-iron (Ni—Fe) alloy, a cobalt-zirconium oxide alloy, or the like, like the magnetic layers 222 and 242 of the second and fourth magnetic members 220 and 240, but the material of the first and third magnetic members 210 and 230 is not limited thereto as long as it is a magnetic material having a high magnetic permeability. The first and third magnetic members 210 and 230 may also be cut to required sizes and disposed into the first and second cavities 111H and 112H of the first and second core layers 111 and 112, respectively. Therefore, the first and third magnetic members 210 and 230 can be embedded into the printed circuit board in any size without being limited on the basis of a work size.

Although not illustrated, the magnetic members 200 according to the present disclosure are not necessarily required to have a double-layer structure in a vertical direction, and the plurality of magnetic members 200 may be disposed in a horizontal direction in the single core layer 111. In this case, each of the first magnetic member 210 and the second magnetic member 220 may be embedded in the core layer 111, and the first magnetic member 210 may be the magnetic element type and the second magnetic member 220 may be the laminate type in which the magnetic layer 222 is disposed on the base layer 221 as described above.

Since the first and second magnetic members 210 and 220 are disposed in different forms, they can accordingly be different from each other in inductance increase effect and magnetic permeability. Based thereon, it is possible to secure a degree of freedom in designing the first and second coil patterns 310 and 320 disposed on and under each of the first and second magnetic members 210 and 220. If necessary, both the first and second magnetic members 210 and 220 may be the magnetic element type or in the laminate type.

The first and second magnetic members 210 and 220 disposed in the first cavities 111H may be at least partially covered by the fourth insulating layer 114, and the third and fourth magnetic members 230 and 240 disposed in the second cavities 112H may be at least partially covered by the fifth insulating layer 115. Accordingly, the fourth insulating layer 114 may fill empty spaces of the first cavities 111H, and the fifth insulating layer 115 may fill empty spaces of the second cavities 112H. Meanwhile, an insulating material may be used as a material of the fourth and fifth insulating layers 114 and 115, and the fourth and fifth insulating layers 114 and 115 may include the same material as the first and second core layers 111 and 112 as described above. In particular, the fourth and fifth insulating layers 114 and 115 may include an ABF or the like to fill the first and second cavities 111H and 112H. Boundaries between the fourth and fifth insulating layers 114 and 115 and the core insulating layers 113 may be clear or unclear.

As a material of the first and second wiring layers 121 and 122, a metal material may be used. Here, the metal material may be copper (Cu), aluminum (Al), silver (Ag), tin (Sn), gold (Au), nickel (Ni), lead (Pb), titanium (Ti), or an alloy thereof. The first and second wiring layers 121 and 122 may be formed by plating such as an additive process (AP), a semi additive process (SAP), a modified semi additive process (MSAP), or tenting (TT). As a result, each of the first and second wiring layers 121 and 122 may include a seed layer, an electroless plating layer, and an electrolytic plating layer, formed on the basis of the seed layer. The first and second wiring layers 121 and 122 may perform various functions according to the designs of the layers. For example, the first and second wiring layers 121 and 122 may include a ground (GND) pattern, a power (PWR) pattern, a signal (S) pattern, and the like. Here, the signal (S) pattern may include various signals, e.g. data signals, excluding the ground (GND) pattern, the power (PWR) pattern, and the like. If necessary, the ground (GND) pattern and the power (PWR) pattern may be the same pattern. Each of these patterns may include a line pattern, a plane pattern, and/or a pad pattern.

The first and second coil patterns 310 and 320 may be disposed on and under the core substrate 110, respectively, and may have a planar spiral structure as illustrated in FIG. 5. In addition, each of the first and second coil patterns 310 and 320, which may correspond to a coil pattern 311 shown in FIG. 5 as an example, may include two connection pads, which may correspond to connection pads 311P shown in FIG. 5 as an example, connected to both ends of the planar spiral structure, respectively. This means that each of the first and second coil patterns 310 and 320 includes an independent coil layer at the same level. In other words, each of the first and second coil patterns 310 and 320 may be a coil having a plurality of turns on the same plane. In this form, a high inductance can be implemented while the first and second coil patterns 310 and 320 are thin. Here, although FIG. 5 illustrates the first coil pattern 310, the second coil pattern 320 may also have an identical or similar shape thereto. As described above, the first and second coil patterns 310 and 320 include independent spiral coil structures from each other and are not required to be directly connected to each other. Even though the first and second coil patterns 310 and 320 are not directly connected to each other, each may independently perform a function as an inductor.

The first and second coil patterns 310 and 320 may be formed simultaneously with the formation of the first and second wiring layers 121 and 122, respectively. As a material of the first and second coil patterns 310 and 320, a metal material may be used. Here, the metal material may be copper (Cu), aluminum (Al), silver (Ag), tin (Sn), gold (Au), nickel (Ni), lead (Pb), titanium (Ti), or an alloy thereof. The first and second coil patterns 310 and 320 may be formed by plating such as an additive process (AP), a semi additive process (SAP), a modified semi additive process (MSAP), or tenting (TT). As a result, each of the first and second coil patterns 310 and 320 may include a seed layer, an electroless plating layer, and an electrolytic plating layer, formed on the basis of the seed layer.

Meanwhile, the first coil pattern 310 may include a 1-1st coil pattern 311 disposed on the first magnetic member 210 and a 1-2nd coil pattern 312 disposed on the second magnetic member 220. In addition, the second coil pattern 320 may include a 2-1st coil pattern 321 disposed on the third magnetic member 230 and a 2-2nd coil pattern 322 disposed on the fourth magnetic member 240. Thus, the 1-1st, 1-2nd, 2-1st, and 2-2nd coil patterns 311, 312, 321, and 322 may include 1-1st, 1-2nd, 2-1st, and 2-2nd connection pads 311P, 312P, 321P, 322P, respectively.

Meanwhile, although not illustrated, each of the first and second coil patterns 310 and 320 may include a plurality of planar spiral structures, and the plurality of planar spiral structures may be stacked in a thickness direction of the printed circuit board.

As illustrated in FIG. 3, the first coil pattern 310 may be disposed on the core substrate 110 to be close to the first and second magnetic members 210 and 220, and the second coil pattern 320 may be disposed below the core substrate 110 to be close to the third and fourth magnetic members 230 and 240. To this end, the first and second coil patterns 310 and 320 may be disposed to be aligned in the thickness direction. In addition, the first and second coil patterns 310 and 320 may have the same or substantially the same width. Here, the width of the coil pattern may refer to a length from the center of the pattern to the outermost side of the pattern. Furthermore, the first and second coil patterns 310 and 320 may have the same or substantially the same width as the magnetic members 200. Since the first and second coil patterns 310 and 320 are disposed above and below the magnetic members 200 and adjacent to the magnetic members 200, a high inductance can be implemented within a limited space of the printed circuit board 100A.

In the printed circuit board 100A according to the first exemplary embodiment as illustrated in FIG. 3, the magnetic members 200 including the first to fourth magnetic members 210, 220, 230, and 240 are arranged in two layers. However, the magnetic members 200 may be arranged in more than two layers. In this case, additional build-up layers may be disposed above the first and second build-up layers 110A and 110B together to cover the magnetic members 200.

As a material of the first and second coil patterns 310 and 320, a metal material may be used. Here, the metal material may be copper (Cu), aluminum (Al), silver (Ag), tin (Sn), gold (Au), nickel (Ni), lead (Pb), titanium (Ti), or an alloy thereof. In this case, the first and second coil patterns 310 and 320 may be formed, simultaneously with the formation of the first wiring layer 121 and the second wiring layer 122, respectively, by the above-described plating. As a result, each of the first and second coil patterns 310 and 320 may include a seed layer, an electroless plating layer, and an electrolytic plating layer, formed on the basis of the seed layer.

The through via 131 may be a first via layer 131. Meanwhile, as a material of the through via 131 as well, a metal material may be used. Here, the metal material may be copper (Cu), aluminum (Al), silver (Ag), tin (Sn), gold (Au), nickel (Ni), lead (Pb), titanium (Ti), or an alloy thereof. The through via 131 may also be formed by plating such as AP, SAP, MSAP, or TT. As a result, the through via 131 may include a seed layer, an electroless plating layer, and an electrolytic plating layer, formed on the basis of the seed layer. Wiring vias of the through via 131 may be each completely filled with the metal material, or the metal material may be formed along wall surfaces of via holes. In addition, any known shape, such as an hourglass shape or a cylindrical shape, may be applied to the through via 131. The through via 131 may also perform various functions according to the design of the layer. For example, the through via 131 may include a wiring via for signal connection, a wiring via for ground connection, a wiring via for power connection, and the like. The wiring via for ground connection and the wiring via for power connection may be the same wiring via.

The sixth to ninth insulating layers 116 to 119 may provide insulating areas for forming multi-layered wirings on both sides of the core substrate 110. As a material of the sixth to ninth insulating layers 116 to 119, an insulating material may be used. Here, the insulating material may be a thermosetting resin such as an epoxy resin, a thermoplastic resin such as polyimide, or a material including a reinforcing material such as a glass fiber and/or an inorganic filler together with the aforementioned resin, e.g. prepreg or ABF. If necessary, a photo image-able dielectric (PID) may be used as a material of the sixth to ninth insulating layers 116 to 119. Meanwhile, the sixth to ninth insulating layers 116 to 119 may include the same material or different materials. Boundaries between the sixth to ninth insulating layers 116 to 119 may be clear or unclear.

As a material of the first to sixth wiring layers 121 to 126, a metal material may be used. Here, the metal material may be copper (Cu), aluminum (Al), silver (Ag), tin (Sn), gold (Au), nickel (Ni), lead (Pb), titanium (Ti), or an alloy thereof. Each of the first to sixth wiring layers 121 to 126 may be formed by plating such as AP, SAP, MSAP, or TT. As a result, each of the first to sixth wiring layers 121 to 126 may include a seed layer, an electroless plating layer, and an electrolytic plating layer, formed on the basis of the seed layer. The first to sixth wiring layers 121 to 126 may perform various functions according to the designs of the layers. For example, the first to sixth wiring layers 121 to 126 may include a ground (GND) pattern, a power (PWR) pattern, a signal (S) pattern, and the like. Here, the signal (S) pattern may include various signals, e.g. data signals, excluding the ground (GND) pattern, the power (PWR) pattern, and the like. If necessary, the ground (GND) pattern and the power (PWR) pattern may be the same pattern. Each of these patterns may include a line pattern, a plane pattern, and/or a pad pattern.

As a material of the second to fifth via layers 132 to 135 as well, a metal material may be used. Here, the metal material may be copper (Cu), aluminum (Al), silver (Ag), tin (Sn), gold (Au), nickel (Ni), lead (Pb), titanium (Ti), or an alloy thereof. Each of the second to fifth via layers 132 to 135 may also be formed by plating such as AP, SAP, MSAP, or TT. As a result, each of the second to fifth via layers 132 to 135 may include a seed layer, an electroless plating layer, and an electrolytic plating layer, formed on the basis of the seed layer. Wiring vias of the second to fifth via layers 132 to 135 may be each completely filled with the metal material, or the metal material may be formed along wall surfaces of via holes. In addition, any known shape, such as a tapered shape, may be applied to the second to fifth via layers 132 to 135. As an example, the wiring vias of the third and fifth via layers 133 and 135 and the wiring vias of the second and fourth via layers 132 and 134 may have tapered shapes in opposite directions to each other. The second to fifth via layers 132 to 135 may also perform various functions according to the designs of the layers. For example, the second to fifth via layers 132 to 135 may include a wiring via for signal connection, a wiring via for ground connection, a wiring via for power connection, and the like. The wiring via for ground connection and the wiring via for power connection may be the same wiring via.

The first and second passivation layers 141 and 142 may protect the internal components of the printed circuit board 100A according to the first exemplary embodiment from external physical and chemical damage. The first and second passivation layers 141 and 142 may include a thermosetting resin. For example, the first and second passivation layers 141 and 142 may be ABFs. However, the material of the first and second passivation layers 141 and 142 is not limited thereto, and each of the first and second passivation layers 141 and 142 may be a known solder resist (SR) layer. If necessary, the first and second passivation layers 141 and 142 may also include a PID. The first and second passivation layers 141 and 142 may have a plurality of openings 141h and 142h, respectively. The plurality of openings 141h and 142h may expose at least a portion the fifth and sixth wiring layers 125 and 126, which are the uppermost and lowermost wiring layers of the printed circuit board 100A according to the first exemplary embodiment, respectively. Meanwhile, surface treatment layers may be formed on the exposed surfaces of the fifth and sixth wiring layers 125 and 126. The surface treatment layer may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like. If necessary, each of the openings 141h and 142h may include a plurality of via holes. If necessary, an under-bump metallurgy (UBM) bump may be disposed on each of the openings 141h and 142h to improve reliability.

The first and second electrical connection metals 151 and 152 are components for physically and/or electrically connecting the printed circuit board 100A according to the first exemplary embodiment to the outside. For example, an electronic component 400 may be mounted on the printed circuit board 100A according to the first exemplary embodiment through the first electrical connection metal 151. In addition, the printed circuit board 100A according to the first exemplary embodiment may be mounted on the main board of the electronic device through the second electrical connection metal 152. For example, the printed circuit board 100A according to the first exemplary embodiment may be a ball grid array (BGA)-type package substrate. The electrical connection metals 151 and 152 may be disposed on the plurality of openings 141h and 142h of the first and second passivation layers 141 and 142, respectively. Each of the first and second electrical connection metals 151 and 152 may be made of a low melting point metal having a lower melting point than copper (Cu), e.g. tin (Sn) or an alloy containing tin (Sn). For example, the electrical connection metals 151 and 152 may be formed of solder, but this is only an example, and the material is not particularly limited thereto.

The first and second electrical connection metals 151 and 152 may be lands, balls, pins, or the like. The first and second electrical connection metals 151 and 152 may be formed in multiple layers or in a single layer. The first and second electrical connection metals 151 and 152 may include copper pillars and solder when formed in multiple layers, and may include tin-silver solder when formed in a single layer. However, this is also only an example, and the material is not limited thereto. The number, distance, arrangement form, etc. of the first and second electrical connection metals 151 and 152 are not particularly limited, and may be sufficiently modified by those skilled in the art according to details of designs. Since the second electrical connection metal 152 is for mounting the printed circuit board on the main board, the number and size of second electrical connection metals 152 may be larger than those of the first electrical connection metals 151. From this point of view, the number and size of the plurality of second openings 142h may be larger than those of the plurality of first openings 141h.

The electronic component 400 may be a known active or passive component. For example, the electronic component 400 may be a semiconductor chip or a semiconductor package including a semiconductor chip. However, the electronic component 400 is not limited thereto, and may be another known surface-mounted component.

FIG. 4 is a cross-sectional view schematically illustrating a printed circuit board according to a second exemplary embodiment in the present disclosure.

The printed circuit board 100B according to the second exemplary embodiment in the present disclosure of FIG. 4 may be different, in the positions of the magnetic members 200, as compared with the printed circuit board 100A according to the first exemplary embodiment in the present disclosure. Therefore, for the configuration overlapping with that of the printed circuit board 100A according to the first exemplary embodiment in the present disclosure, the above description of the printed circuit board 100A according to the first exemplary embodiment in the present disclosure may be identically applicable. The printed circuit board 100B according to the second exemplary embodiment in the present disclosure will be described focusing on components modified from those in the previous exemplary embodiment.

The printed circuit board 100B according to the second exemplary embodiment in the present disclosure of FIG. 4 is different, in the respective positions of the magnetic members 200, as compared with the printed circuit board 100A according to the first exemplary embodiment. For example, the first to fourth magnetic members 210, 220, 230, and 240 may be disposed on the first core insulating layer 113a. Specifically, the first and second magnetic members 210 and 220 may be disposed on one surface of the first core insulating layer 113a while being disposed inside the first cavities 111h, and the third and fourth magnetic members 230 and 240 may be disposed on the other surface of the first core insulating layer 113a while being disposed inside the second cavities 112h. In this way, a distance between the magnetic members 200 embedded in the core substrate 110 having a multilayer structure can be reduced, thereby achieving a magnetic flux increasing effect.

The above description of the first and second coil patterns 310 and 320 illustrated in FIG. 5 may also be identically applied to the printed circuit board 100B according to the second exemplary embodiment of FIG. 4.

Figure 6:
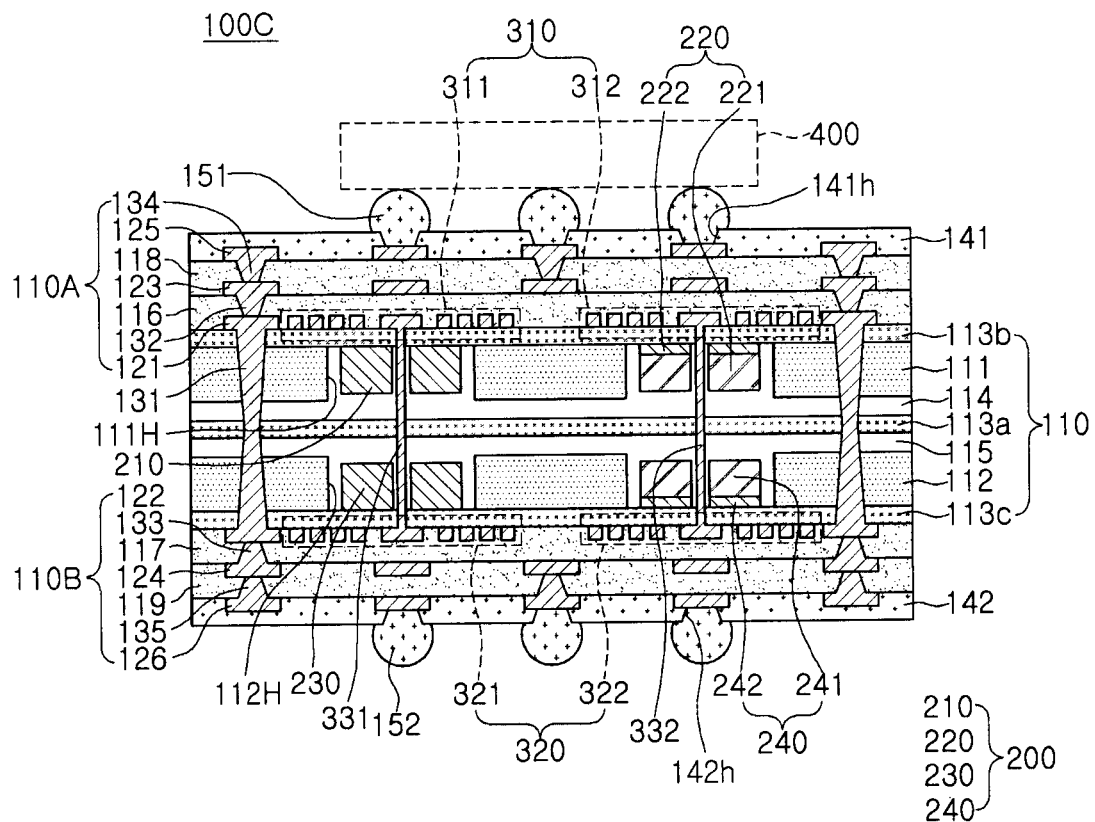
FIG. 6 is a cross-sectional view schematically illustrating a printed circuit board according to a third exemplary embodiment in the present disclosure.
Figure 9:
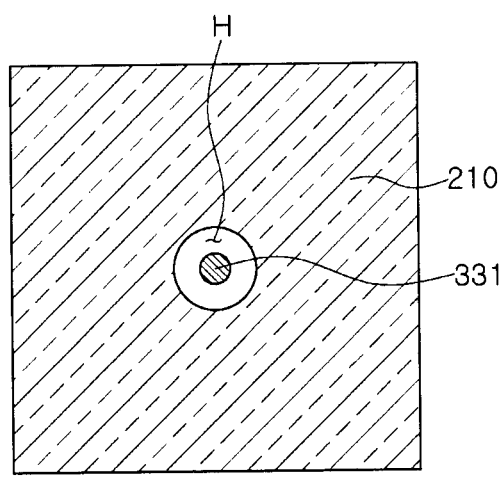
FIG. 9 is a plan view schematically illustrating a partial cross-sectional view of a magnetic member in the printed circuit boards of FIGS. 6 and 7.

FIG. 6 is a cross-sectional view schematically illustrating a printed circuit board according to a third exemplary embodiment in the present disclosure, and FIG. 9 is a plan view schematically illustrating a partial cross-sectional view of a magnetic member in the printed circuit boards of FIG. 6 and FIG. 7 to be described later.

The printed circuit board 100C according to FIG. 6 is different, in that connection vias 331 and 332 are further included, as compared with the printed circuit board 100A according to the first exemplary embodiment of FIG. 3. Therefore, for the configuration overlapping with that of the printed circuit board 100A, the above description of the printed circuit board 100A according to the first exemplary embodiment may be identically applicable. The printed circuit board 100C according to the third exemplary embodiment in the present disclosure will be described focusing on components modified from those in the previous exemplary embodiment.

Although not illustrated, each of the first and second coil patterns 310 and 320 may have a plurality of planar spiral structures, and the plurality of planar spiral structures may be implemented to be stacked in a thickness direction of the printed circuit board. That is, for the first coil pattern 310, multiple coil layers may be connected to each other to form a single coil structure. This is the same for the second coil pattern 320. To this end, in each of the first and second coil patterns 310 and 320, the plurality of planar spiral structures may be connected to each other by a connection via (not illustrated). When each of the first and second coil patterns 310 and 320 includes multiple coil layers as in the present embodiment, the number of turns of the coil can be increased, thereby further improving inductance characteristics.

Meanwhile, the printed circuit board 100C according to the third exemplary embodiment of FIG. 6 may further include a plurality of connection vias 331 and 332. The connection vias 331 and 332 may include first and second connection vias 331 and 332, and the first and second coil patterns 310 and 320 may be connected to each other by the connection vias 331 and 332. The first and second the connection vias 331 and 332 may penetrate through the core substrate 110 to electrically connect the first and second coil patterns 310 and 320 to each other. Meanwhile, as in the first exemplary embodiment, the first coil pattern 310 may include a 1-1st coil pattern 311 disposed on the first magnetic member 210 and a 1-2nd coil pattern 312 disposed on the second magnetic member 220. The second coil pattern 320 may also include a 2-1st coil pattern 321 disposed on the third magnetic member 230 and a 2-2nd coil pattern 322 disposed on the fourth magnetic member 240.

Thus, the 1-1st coil pattern 311 and the 2-1st coil pattern 321 may form a single coil structure as a whole, and the 1-2nd coil pattern 312 and the 2-2nd coil pattern 322 may form another single coil structure as a whole.

As a material of the first and second connection vias 331 and 332 as well, a metal material may be used. Here, the metal material may be copper (Cu), aluminum (Al), silver (Ag), tin (Sn), gold (Au), nickel (Ni), lead (Pb), titanium (Ti), or an alloy thereof. The first and second connection vias 331 and 332 may also be formed by plating such as AP, SAP, MSAP, or TT. As a result, each of the first and second connection vias 331 and 332 may include a seed layer, an electroless plating layer, and an electrolytic plating layer, formed on the basis of the seed layer. Wiring vias of the first and second connection vias 331 and 332 may be each completely filled with the metal material, or the metal material may be formed along wall surfaces of via holes. In addition, any known shape, such as an hourglass shape or a cylindrical shape, may be applied to the first and second connection vias 331 and 332. The first and second connection vias 331 and 332 may also perform various functions according to the designs of the layers. For example, the first and second connection vias 331 and 332 may include a wiring via for signal connection, a wiring via for ground connection, a wiring via for power connection, and the like. The wiring via for ground connection and the wiring via for power connection may be the same wiring via.

Figure 8:
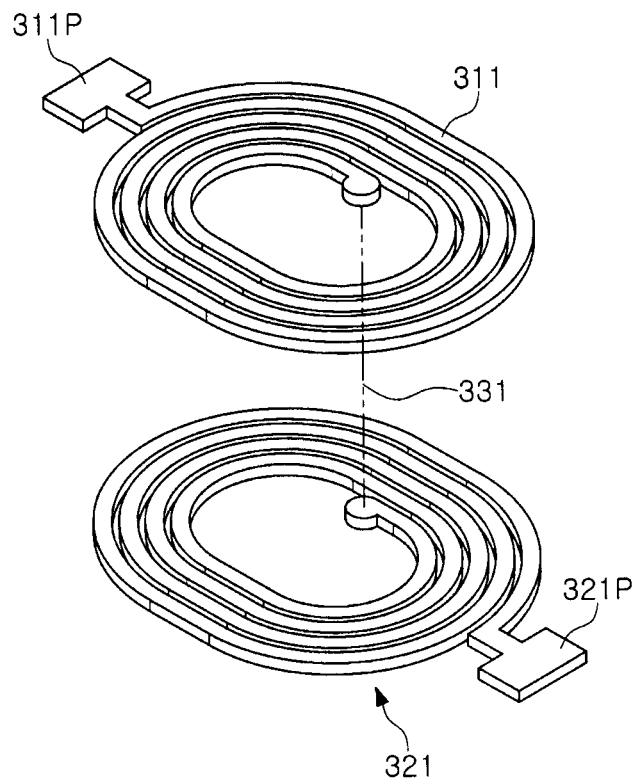
FIG. 8 is a plan view schematically illustrating an example of a coil pattern applied to the printed circuit boards of FIGS. 6 and 7.

In this case, as illustrated, the connection vias 331 and 332 may be implemented to penetrate through the magnetic members 200. Specifically, the first connection via 331 may penetrate through each of the first and third magnetic members 210 and 230 to connect the 1-1st coil pattern 311 and the 2-1st coil pattern 321. The second connection via 332 may also penetrate through each of the second and fourth magnetic members 220 and 240 to connect the 1-2nd coil pattern 312 and the 2-2nd coil pattern 322. When the connection vias 331 and 332 penetrate the magnetic members 200 to connect the first and second coil patterns 310 and 320, as illustrated in FIG. 8, the connection vias 331 and 332 may connect the respective innermost ends of the first and second coil patterns 310 and 320 (corresponding to pad areas connected by 331 in FIG. 8).

The connection pad 310P disposed at the other end of the first coil pattern 310 may be connected to another circuit pattern on the same layer, for example, the first wiring layer 121, and the connection pad 310P and the first wiring layer 121 may be disposed on the same plane. The connection pad 320P disposed at the other end of the second coil pattern 320 may be connected to another circuit pattern on the same layer, for example, the second wiring layer 122, and the connection pad 320P and the second wiring layer 122 may be disposed on the same plane.

Meanwhile, although not illustrated, the connection vias 331 and 332 may be disposed adjacent to side surfaces of the magnetic members 200. In this case, the connection vias 331 and 332 are not required to penetrate through the magnetic members 200.

Figure 7:
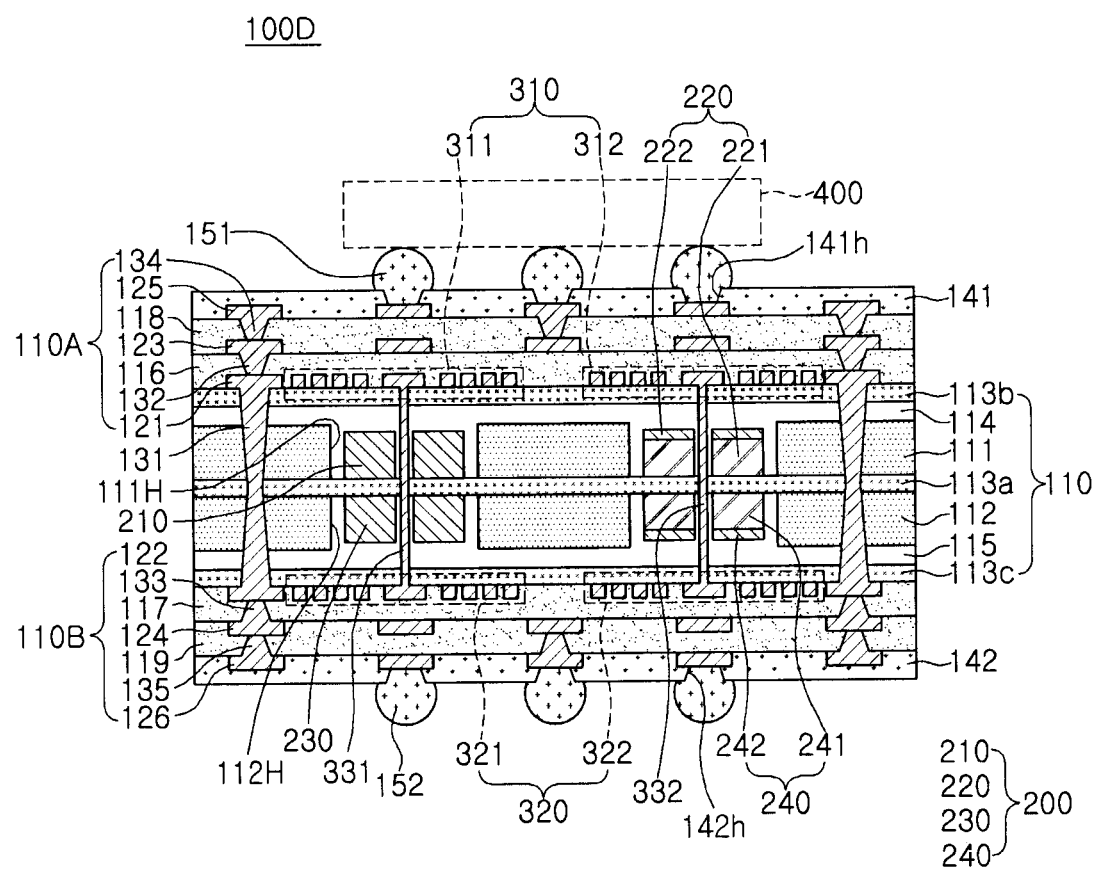
FIG. 7 is a cross-sectional view schematically illustrating a printed circuit board according to a fourth exemplary embodiment in the present disclosure.

FIG. 7 is a cross-sectional view schematically illustrating a printed circuit board according to a fourth exemplary embodiment in the present disclosure.

The printed circuit board 100D according to the fourth exemplary embodiment in the present disclosure of FIG. 7 may be different, in the positions of the magnetic members 200, as compared with the printed circuit board 100C according to the third exemplary embodiment in the present disclosure. Therefore, for the configuration overlapping with that of the printed circuit board 100C according to the third exemplary embodiment in the present disclosure, the above description of the printed circuit board 100C according to the third exemplary embodiment in the present disclosure may be identically applicable. The printed circuit board 100D according to the fourth exemplary embodiment in the present disclosure of FIG. 7 will be described focusing on components modified from those in the previous exemplary embodiment.

The printed circuit board 100D according to the fourth exemplary embodiment in the present disclosure of FIG. 7 is different, in the respective positions of the magnetic members 200, as compared with the printed circuit board 100C according to the third exemplary embodiment. For example, the first to fourth magnetic members 210 to 240 may be disposed on the first core insulating layer 113a. Specifically, the first and second magnetic members 210 and 220 may be disposed on one surface of the first core insulating layer 113a while being disposed inside the first cavities 111h, and the third and fourth magnetic members 230 and 240 may be disposed on the other surface of the first core insulating layer 113a while being disposed inside the second cavities 112h. In this way, a distance between the magnetic members 200 embedded in the core substrate 110 having a multilayer structure can be reduced, thereby achieving a magnetic flux increasing effect.

The above description of the first and second coil patterns 310 and 320 illustrated in FIG. 6 may also be identically applied to the printed circuit board 100D according to the fourth exemplary embodiment of FIG. 7.

FIG. 9 is a plan view schematically illustrating a partial cross-sectional view of the magnetic member in the printed circuit boards of FIGS. 6 and 7.

As illustrated in FIG. 9, a through hole H may be formed in the first magnetic member 210, and the first connection via 331 may penetrate through the through hole H to electrically connect the 1-1st coil pattern 311 and the 2-1st coil pattern 321 to each other. Although not illustrated, the first connection via 331 may additionally penetrate through the third magnetic member 230. In FIG. 9, only the first connection via 331 penetrating through the first and third magnetic members 210 and 230 is illustrated. However, this structure may also be applied identically to the second connection via 332 penetrating through the second and fourth magnetic members 220 and 240.

Figure 10:
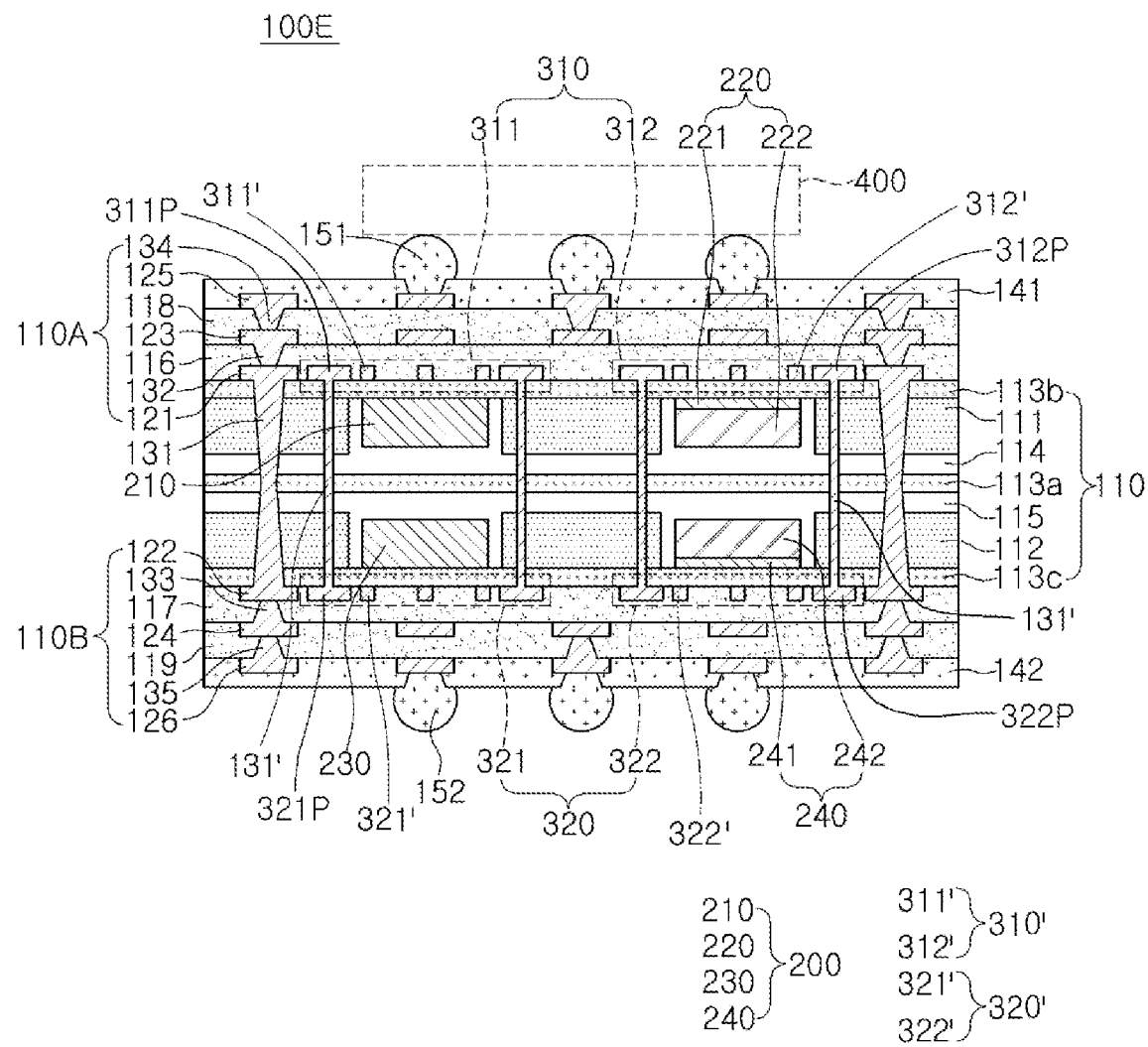
FIG. 10 is a cross-sectional view schematically illustrating a printed circuit board according to a fifth exemplary embodiment in the present disclosure.
Figure 11:
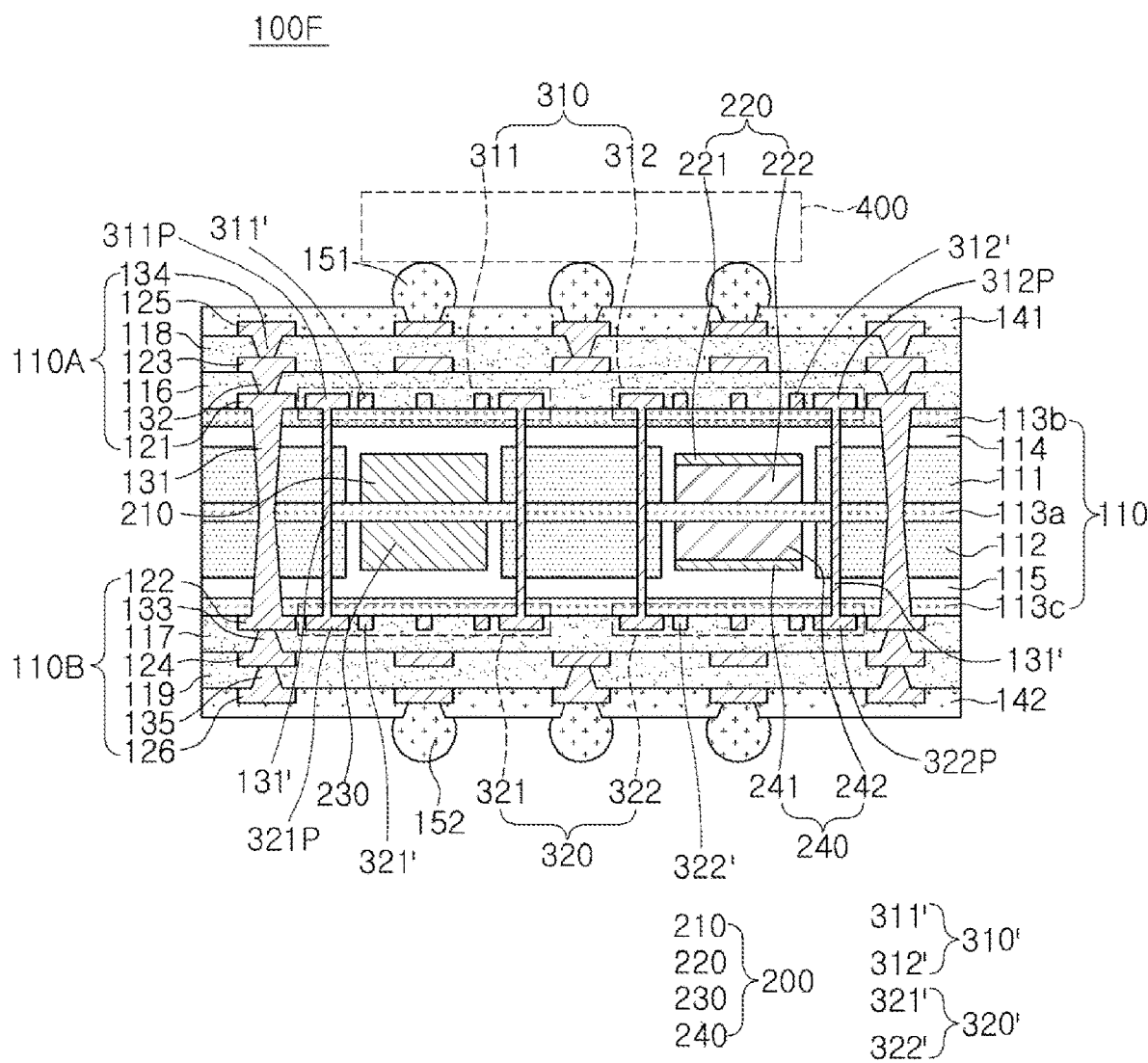
FIG. 11 is a cross-sectional view schematically illustrating a printed circuit board according to a sixth exemplary embodiment in the present disclosure.
Figure 12:
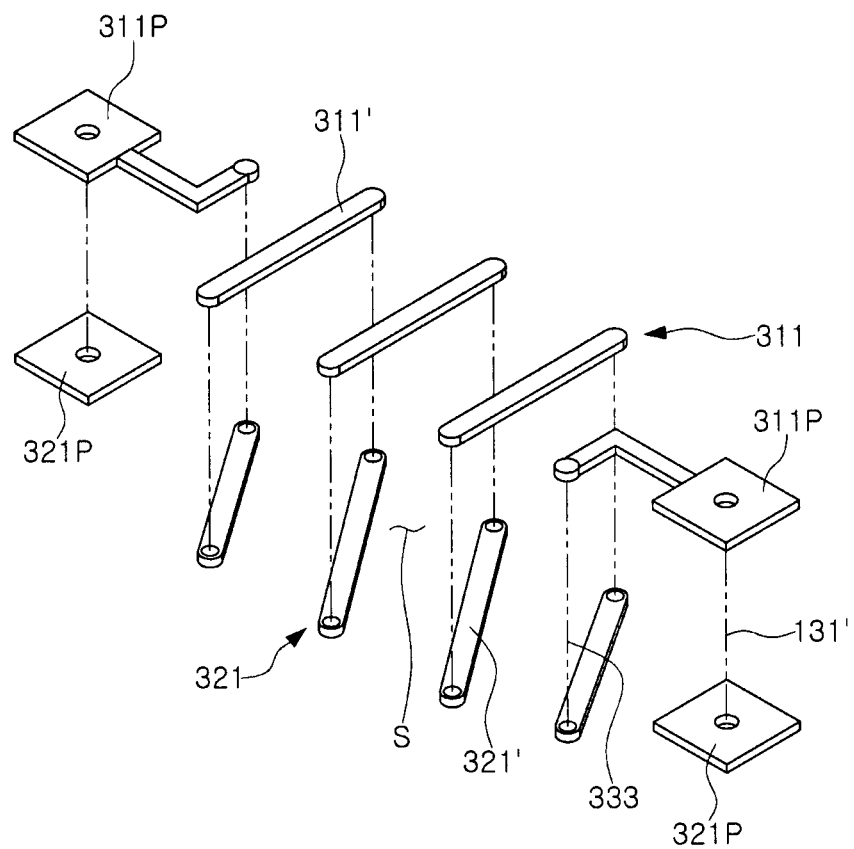
FIG. 12 is a plan view schematically illustrating an example of a coil pattern applied to the printed circuit boards of FIGS. 10 and 11.

FIG. 10 is a cross-sectional view schematically illustrating a printed circuit board according to a fifth exemplary embodiment in the present disclosure, and FIG. 12 is a plan view schematically illustrating an example of a coil pattern applied to the printed circuit boards of FIG. 10 and FIG. 11 to be described later.

The printed circuit board 100E according to the fifth exemplary embodiment of FIG. 10 is different, in that each of the first and second coil patterns 310 and 320 further includes a pad connection via 131' connecting the connection pads 310P and 320P to each other without having a planar spiral structure, as compared with the printed circuit board 100A according to the first exemplary embodiment of FIG. 3. Therefore, for the configuration overlapping with that of the printed circuit board 100A, the above description of the printed circuit board 100A according to the first exemplary embodiment may be identically applicable. The printed circuit board 100E according to the fifth exemplary embodiment in the present disclosure will be described focusing on components modified from those in the previous exemplary embodiment.

In the printed circuit board 100E according to the fifth exemplary embodiment, the first and second coil patterns 310 and 320 may include a plurality of first and second connection parts 310' and 320' spaced apart from each other, respectively. Specifically, the first connection part 310' may include 1-1st connection parts 311' and 1-2nd connection parts 312', and the second connection part 320' may include 2-1st connection parts 321' and 2-2nd connection parts 322'.

For example, the 1-1st coil pattern 311 may include a plurality of 1-1st connection parts 311' spaced apart from each other, and the 1-2nd coil pattern 312 may include a plurality of 1-2nd connection parts 312' spaced apart from each other. Also, the 2-1st coil pattern 321 may include a plurality of 2-1st connection parts 321' spaced apart from each other, and the 2-2nd coil pattern 322 may include a plurality of 2-2nd connection parts 322' spaced apart from each other.

The above-described first and second connection parts 310' and 320' may be electrically connected to each other by a plurality of connection vias 333. In this case, the connection vias 333 may be disposed to penetrate through the core substrate 110 to electrically connect the first coil pattern 310 provided on the core substrate 110 and the second coil pattern 320 provided below the core substrate 110 to each other.

In the printed circuit board according to the fifth exemplary embodiment, the first and second connection pads 310P and 320P may be electrically connected to each other by a plurality of pad connection vias 131'. The plurality of pad connection vias 131' may be disposed adjacent to side surfaces of the magnetic member 200.

As a material of the first and second connection parts 310' and 320' as well, a metal material may be used. Here, the metal material may be copper (Cu), aluminum (Al), silver (Ag), tin (Sn), gold (Au), nickel (Ni), lead (Pb), titanium (Ti), or an alloy thereof. The first and second connection parts 310' and 320' may be formed by plating such as AP, SAP, MSAP, or TT. As a result, each of the first and second connection parts 310' and 320' may include a seed layer, an electroless plating layer, and an electrolytic plating layer, formed on the basis of the seed layer.

As a material of the connection vias 333 and the pad connection vias 131' as well, a metal material may be used. Here, the metal material may be copper (Cu), aluminum (Al), silver (Ag), tin (Sn), gold (Au), nickel (Ni), lead (Pb), titanium (Ti), or an alloy thereof. The connection vias 333 and the pad connection vias 131' may also be formed by plating such as AP, SAP, MSAP, or TT. As a result, each of the connection vias 333 and the pad connection vias 131' may include a seed layer, an electroless plating layer, and an electrolytic plating layer, formed on the basis of the seed layer. Wiring vias of the connection vias 333 and the pad connection vias 131' may be each completely filled with the metal material, or the metal material may be formed along wall surfaces of via holes. In addition, any known shape, such as an hourglass shape or a cylindrical shape, may be applied to the connection vias 333 and the pad connection vias 131'. The connection vias 333 and the pad connection vias 131' may also perform various functions according to the designs of the layers. For example, the connection vias 333 and the pad connection vias 131' may include a wiring via for signal connection, a wiring via for ground connection, a wiring via for power connection, and the like. The wiring via for ground connection and the wiring via for power connection may be the same wiring via.

FIG. 12 illustrates a configuration of the connection vias 333 connecting the 1-1st coil pattern 311 and the 2-1st coil pattern 321 in the printed circuit board 100E according to the fifth exemplary embodiment. As described above, the 1-1st coil pattern 311 may include a plurality of 1-1st connection parts 311' spaced apart from each other, and the 2-1st coil pattern 321 may include a plurality of 2-1st connection parts 321' spaced apart from each other.

In addition, the 1-1st connection pads 311P may be disposed at one ends of two outermost 1-1st connection parts 311' among the plurality of 1-1st connection parts 311' of the 1-1st coil pattern 311. That is, the 1-1st connection pads 311P may be disposed at both ends of the 1-1st coil pattern 311. In addition, the 2-1st connection pads 321P may be disposed at positions adjacent to the plurality of the 2-1st connection parts 321' of the 2-1st coil pattern 321, and the 2-1st connection pads 321P are not required to be directly connected to the 2-1st connection parts 321'.

Meanwhile, the 1-1st connection pad 311P and the 2-1st connection pad 321P may be electrically connected to each other through the pad connection via 131'.

Accordingly, in the printed circuit board 100E according to the fifth exemplary embodiment, the first and third magnetic members 210 and 230 may be surrounded by the 1-1st and 2-1st coil patterns 311 and 321, the connection vias 333, and the pad connection vias 131' illustrated in FIG. 12.

The 1-1st coil pattern 311, the 2-1st coil pattern 321, and the pad connection vias 131' may form a structure surrounding a magnetic member, similar to a wound-type inductor structure. For example, the first and third magnetic members 210 and 230 may be disposed in a space S of FIG. 12. By disposing the magnetic members, it is possible to improve an inductance L of the above-described wound-type inductor structure.

In FIG. 12, the 1-1st coil pattern 311 and the 2-1st coil pattern 321 are illustrated, but the same structure may be applied to the 1-2nd coil pattern 312 and the 2-2nd coil pattern 322. In this case, the second and fourth magnetic members 220 and 240 may be surrounded by the 1-2nd and 2-2nd coil patterns 312 and 322, the connection vias 333, and the pad connection vias 131'.

FIG. 11 is a cross-sectional view schematically illustrating a printed circuit board according to a sixth exemplary embodiment in the present disclosure.

The printed circuit board 100F according to the sixth exemplary embodiment in the present disclosure of FIG. 11 may be different, in the positions of the magnetic members 200, as compared with the printed circuit board 100E according to the fifth exemplary embodiment in the present disclosure. Therefore, for the configuration overlapping with that of the printed circuit board 100E according to the fifth exemplary embodiment in the present disclosure, the above description of the printed circuit board 100E according to the fifth exemplary embodiment in the present disclosure may be identically applicable. The printed circuit board 100F according to the sixth exemplary embodiment of FIG. 11 will be described focusing on components modified from those in the previous exemplary embodiment.

The printed circuit board 100F according to the sixth exemplary embodiment in the present disclosure of FIG. 11 is different, in the respective positions of the magnetic members 200, as compared with the printed circuit board 100E according to the fifth exemplary embodiment. For example, the first to fourth magnetic members 210, 220, 230, and 240 may be disposed on the first core insulating layer 113a. Specifically, the first and second magnetic members 210 and 220 may be disposed on one surface of the first core insulating layer 113a while being disposed inside the first cavities 111h, and the third and fourth magnetic members 230 and 240 may be disposed on the other surface of the first core insulating layer 113a while being disposed inside the second cavities 112h. In this way, a distance between the magnetic members 200 embedded in the core substrate 110 in the multilayer structure can be reduced, thereby achieving a magnetic flux increasing effect.

The above description of the first and second coil patterns 310 and 320 of the printed circuit board 100E according to the fifth exemplary embodiment may also be identically applied to the printed circuit board 100F according to the sixth exemplary embodiment of FIG. 11.

As set forth above, according to the exemplary embodiment in the present disclosure, it is possible to provide a printed circuit board having an inductor function capable of maintaining a high magnetic permeability even at a high frequency.

In addition, it is possible to provide a printed circuit board whose core can be manufactured thickly, with a magnetic material embedded in the thick core so that the board can be thin.

While exemplary embodiments have been shown and described above, it will be apparent to those skilled in the art that modifications and variations could be made without departing from the scope of the present invention as defined by the appended claims.

What is claimed is:

1. A printed circuit board comprising:
   a core substrate including a plurality of core layers with a cavity disposed therein and first and second core insulating layers respectively extending on and below the plurality of core layers to cover the cavity;
   a plurality of magnetic members embedded in the cavity;
   a first coil pattern disposed on the first core insulating layer of the core substrate; and
   a second coil pattern disposed below the second core insulating layer the core substrate.

2. The printed circuit board of claim 1, further comprising:
   build-up layers disposed on the first core insulating layer and below the second core insulating layer of the core substrate, respectively.

3. The printed circuit board of claim 2, wherein the plurality of magnetic members are disposed in the cavity.

4. The printed circuit board of claim 3, wherein a plurality of cavities are disposed in each of the plurality of core layers,
   the plurality of magnetic members include at least one of first and second magnetic members,
   the first magnetic member includes a magnetic element, and
   the second magnetic member includes a base layer and a magnetic layer disposed on the base layer.

5. The printed circuit board of claim 4, further comprising a through via penetrating through the core substrate,
   wherein the build-up layers include a plurality of insulating layers and a plurality of wiring layers disposed on the plurality of insulating layers.

6. The printed circuit board of claim 5, wherein the core substrate further includes a third core insulating layer disposed between the plurality of core layers, and
   at least some of the plurality of magnetic members are disposed on one surface and the other surface of the third core insulating layer.

7. The printed circuit board of claim 5, wherein
   at least some of the plurality of magnetic members are in contact with the first core insulating layer and the second core insulating layer.

8. The printed circuit board of claim 5, wherein the first and second coil patterns include first and second connection pads, respectively, each of the first and second connection pads being disposed at one or both ends of the respective coil patterns.

9. The printed circuit board of claim 5, further comprising a connection via connecting respective innermost ends of the first and second coil patterns to each other.

10. The printed circuit board of claim 9, wherein the connection via penetrates through the magnetic members.

11. The printed circuit board of claim 5, wherein each of the first and second coil patterns has a plurality of layers stacked in a thickness direction.

12. The printed circuit board of claim 5, further comprising an electronic component disposed on one of the build-up layers disposed on the one surface and the other surface of the core substrate,
   wherein the magnetic layer is disposed on one of one surface and the other surface of the base layer that is closer to the electronic component.

13. The printed circuit board of claim 4, wherein the base layer includes a wafer containing silicon (Si), and
   the magnetic layer contains a cobalt-tantalum-zirconium alloy.

14. The printed circuit board of claim 1, wherein the first and second coil patterns include a plurality of first and second connection parts spaced apart from each other, respectively, and a plurality of connection vias connecting the plurality of first and second connection parts to each other; and
   the plurality of connection vias are disposed to surround the plurality of magnetic members on at least one side thereof.

15. The printed circuit board of claim 14, further comprising:
   a first connection pad connected to an end of each of at least some of the plurality of first connection parts;
   a second connection pad disposed adjacent to a side surface of each of at least one of the plurality of second connection parts; and
   a pad connection via penetrating through the core substrate to connect the first and second connection pads to each other.

16. The printed circuit board of claim 1, wherein the plurality of magnetic members are spaced apart from at least one of the first coil pattern and the second coil pattern.

17. A printed circuit board comprising:
   a core substrate having a cavity;
   a plurality of magnetic members embedded in the cavity;
   a first coil pattern disposed on the core substrate and extending from a region of an upper side of the core substrate outside the cavity overlapping the cavity; and
   a second coil pattern disposed below the core substrate and extending from a region of a lower side of the core substrate outside the cavity to a region of the lower side of the core substrate overlapping the cavity,
   wherein the plurality of magnetic members include first and second magnetic members having structures different from each other,
   the first magnetic member includes a magnetic element, and
   the second magnetic member includes a base layer and a magnetic layer attached to the base layer.

18. The printed circuit board of claim 17, further comprising a connection via connecting respective innermost ends of the first and second coil patterns to each other.

19. The printed circuit board of claim 18, wherein the connection via penetrates through one of more magnetic members among the plurality magnetic members.

20. The printed circuit board of claim 17, wherein the plurality of magnetic members are spaced apart from at least one of the first coil pattern and the second coil pattern.

21. A printed circuit board comprising:
   a core substrate including a core insulating layer, and first and second core layers disposed on opposing sides of the core insulating layer, respectively;
   a first coil pattern disposed on the first core layer;
   a second coil pattern disposed below the second core layer;

a first magnetic member disposed in a first cavity of the first core layer and between the first coil pattern and the core insulating layer; and a second magnetic member disposed in a second cavity of the second core layer and between the second coil pattern and the core insulating layer, wherein the first coil pattern is disposed on the core substrate and extends from a region of an upper side of the core substrate outside the first cavity to a region of the upper side of the core substrate overlapping the first cavity; and the second coil pattern is disposed below the core substrate and extends from a region of a lower side of the core substrate outside the second cavity to a region of the lower side of the core substrate overlapping the second cavity.

22. The printed circuit board of claim 21, further comprising build-up layers disposed on the first coil pattern or the second coil pattern.

23. The printed circuit board of claim 21, wherein the first and second magnetic members are spaced apart from at least one of the first coil pattern and the second coil pattern.

\* \* \* \* \*